United States Patent [19]

Noel, Jr.

[11] 4,268,113
[45] May 19, 1981

[54] SIGNAL COUPLING ELEMENT FOR SUBSTRATE-MOUNTED OPTICAL TRANSDUCERS

[75] Inventor: Francis E. Noel, Jr., Knightdale, N.C.

[73] Assignee: International Business Machines Corporation, Armonk, N.Y.

[21] Appl. No.: 30,401

[22] Filed: Apr. 16, 1979

[51] Int. Cl.³ .......................... G02B 5/14; G02B 27/00
[52] U.S. Cl. .................................. 350/96.20; 250/551; 339/17 LC
[58] Field of Search .................... 350/96.20; 250/227, 250/551; 339/17 LC; 357/17, 18, 19

[56] References Cited

U.S. PATENT DOCUMENTS

| | | | |
|---|---|---|---|
| 3,414,733 | 12/1968 | Wunderman | 350/96.20 |
| 3,423,594 | 1/1969 | Galopin | 350/96.20 |
| 3,585,454 | 6/1971 | Roberts | 250/227 |
| 3,987,300 | 10/1976 | Palmer | 250/227 |
| 4,076,376 | 2/1978 | Slaughter | 350/96.20 |
| 4,081,208 | 3/1978 | Meade | 350/96.20 |
| 4,118,100 | 10/1978 | Goell et al. | 350/96.20 |

FOREIGN PATENT DOCUMENTS 2846773 10/1978 Fed. Rep. of Germany.
2387519 11/1978 France.

OTHER PUBLICATIONS

Patents Abstracts of Japan, vol. 1, No. 90, Aug. 22, 1977.
Patents Abstracts of Japan, vol. 2, No. 141, Nov. 22, 1978.
Patents Abstracts of Japan, vol. 3, No. 1, Jan. 11, 1979.

Primary Examiner—Stewart J. Levy
Attorney, Agent, or Firm—Gerald R. Woods

[57] ABSTRACT

Where a solid state optical transducer is mounted on a ceramic substrate, an improved optical signal path is provided by adding a preformed hole to the substrate in alignment with the active region of the transducer. A metal pin having a light transmitting core is inserted into the preformed hole using the same pin insertion techniques used to secure other solid pins to the substrate. The core provides an optical signal path while the cylindrical metal pin can be used both as a heat sink and to provide an additional electrical path to the transducer.

2 Claims, 5 Drawing Figures

SIGNAL COUPLING ELEMENT FOR SUBSTRATE-MOUNTED OPTICAL TRANSDUCERS

TECHNICAL FIELD

The present invention relates to optical transducers and more particularly to a means for providing improved signal coupling where such a transducer is mounted on an insulative substrate.

PRIOR ART

Solid state optical sources, such as light emitting diodes and injection lasers, and optical detectors, such as PIN photodiodes, are widely used in encapsulated solid state circuits. Providing the necessary optical signal path to or from such transducers is an expensive and problem-producing process. Known techniques for providing the necessary optical coupling include the technique of bringing the optical fiber in through the side of a metal cap which covers the transducer and its supporting substrate. It is difficult to achieve a good hermetic seal at the metal cap when this technique is used. Moreover, the connection is relatively fragile.

Another known technique for providing optical coupling between a sealed transducer and an external optical circuit has been to provide a transparent window in the cap of the transducer module. This, however, makes the cap costly. In addition, the necessary physical separation between the transducer and the end of the optical fiber can cause considerable loss in signal strength at their interface.

SUMMARY

The present invention is an improved signal coupling element for an optical transducer which is supported on an insulative substrate. The substrate is provided with a preformed hold aligned with the active region of the transducer. The coupling element includes a hollow metal pin which extends through the preformed hole. The hollow metal pin encloses a light transmitting core, one end of which is adjacent the active region of the transducer. An electrical connection to the transduer is made through the metal pin and an electrically conductive annular button which is on the opposite side of the substrate from the transducer. The button has a tapered bore which serves as a guide for optical fibers to be coupled to the optical fiber within the metal pin.

BRIEF DESCRIPTION OF THE DRAWINGS

While the specification concludes with claims particularly pointing out and distinctly claiming that which is regarded as the present invention, details of a preferred embodiment of the invention along with its further objects and advantages may be more readily ascertained from the following detailed description when read in conjunction with the accompanying drawings wherein:

DETAILED DESCRIPTION

Figure 1:
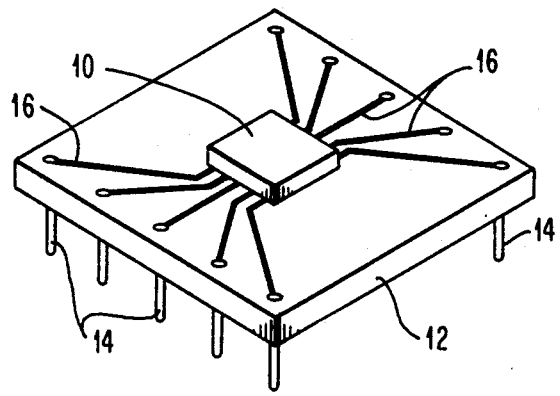
FIG. 1 is a perspective view of one embodiment of a tranducer and supporting substrate.

FIG. 1 shows a solid state optical transducer 10 mounted on an insulative substrate 12. Ceramic is a preferred substrate material. The transducer 10 may be a light source, such as a light emitting diode or an injection laser, or a light detector, such as a photodiode. Electrical connections between the transducer 10 and external circuits are made through an array of solid metal pins 14 which are secured to the substrate 12 at preformed substrate holes. Generally, the pins 14 are slightly larger than the preformed holes to provide an interference fit. Conductive paths 16 extend inwardly from each of the pins 14 to terminal points at the bottom surface of transducer 10.

Figure 2:
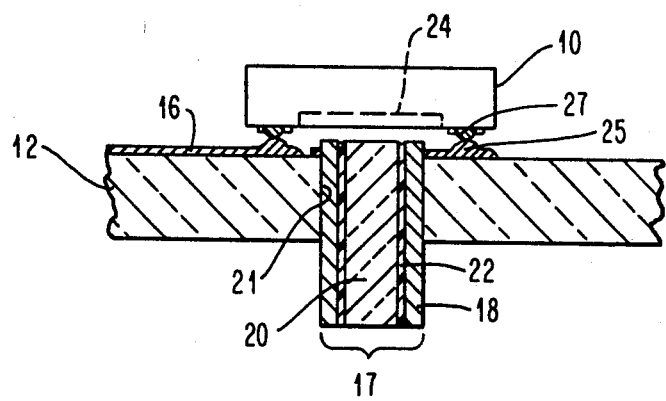
FIG. 2 is a cross-sectional view of a transducer and substrate including the present invention.

The active region of the transducer 10 is located on the surface facing the substrate 12. To provide an optical signal path to the active region, substrate 12 is provided with an additional preformed hole aligned with the transducer. Referring to FIG. 2, an improved signal coupling element 17 includes a hollow metal pin 18 which is inserted through a preformed hole 21 using the same pin insertion techniques which are used to insert conventional solid metal pins at the periphery of the substrate 12. The hollow metal pin 18 encloses a light transmitting core preferably consisting of an optical fiber 20 which may be held in place by a layer 22 of epoxy adhesive. The transducer 10 is mounted on substrate 12 directly above the signal coupling element 17 with its active region 24 being aligned with the exposed end of the optical fiber 20. The end of element 17 is spaced from transducer 10 by an amount on the order of 0.001–0.003 inches (0.0254–0.0762 millimeters) to avoid any damaging contact between the signal coupling element 17 and the relatively soft semi-conductor material from which transducer 10 is fabricated.

The optical fiber 20 permits optical signals to be transmitted to or from the active region 24, depending on the nature of transducer 10. The hollow metal pin 18 can transmit electrical signals or power voltages to transducer 10 simply by adding a conductive path 25 between the exposed end of pin 18 and one of the transducer chip terminals 27. The metal pin 18 also acts as a heat sink, providing a thermal path for conducting heat energy away from transducer 10 through substrate 12.

By using a hollow metal pin having the same external dimensions as the solid metal pins which are used to provide other electrical connections, the signal path to the transducer 10 can be established with conventional pin insertion and hermetic sealing techniques.

Figure 3:
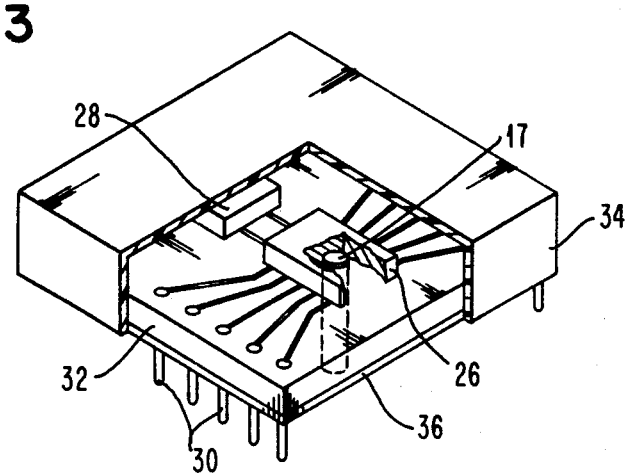
FIG. 3 is a partial, perspective view showing a transducer and support circuitry in a sealed module.

FIG. 3 shows a sealed module including a transducer 26 with necessary electrical support circuits 28 in integrated circuit form. The signal path to the device 26 is provided by a signal coupling element 17 of the type previously described. When the signal coupling element 17 and other solid metal pins 30 have been inserted into a supporting substrate 32, the entire unit is sealed by means of a metal cap 34 and a layer 36 of epoxy sealant. The epoxy sealant 36 secures and seals the metal cap 34 to the substrate 32 while improving the seals around each of the solid metal pins 30 and around the hollow metal pin of the signal coupling element 17.

Figure 4:
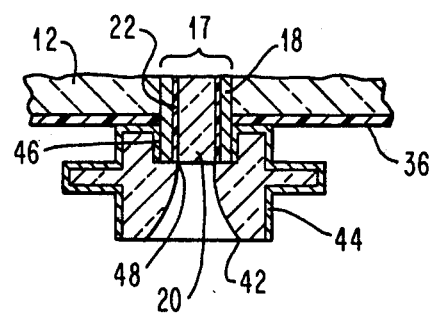
FIG. 4 is a cross-sectional view of one form of exernal electrical/optical connector for use with the improved signal coupling element.

Optical and elecrical connections external to the above-described module can be made using a component of the type shown in FIG. 4. The outer end of the signal coupling element 17 is exposed with both the hollow metal pin 18 and optical fiber core 20 protruding through layer 36 of epoxy sealant. A button 42, which may be glass with a metal coating 44, is forced over the exposed end of the signal coupling element 17. The button 42 has a central bore consisting of a first cylindrical segment 46 having a diameter approximately equal to the diameter of the hollow metal pin 18. A second segment of the bore flares from a minimum diameter at the end 48 of the first segment 46 to a maximum diameter at the outer end of the button 42. This tapered or flared second bore provides a funnel for guiding an external optical fiber (not shown) into alignment with the optical fiber 20 in signal coupling element 17.

Figure 5:
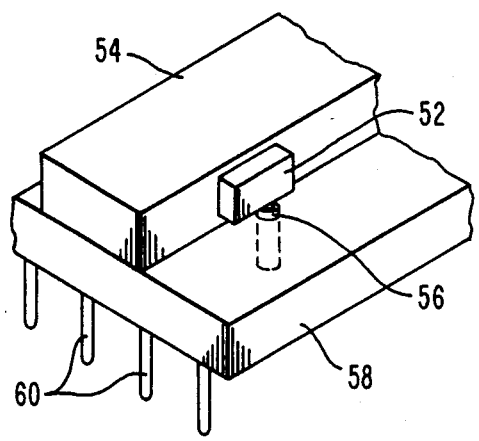
FIG. 5 is a partial, perspective view showing an improved signal coupling element constructed in accordance with the present invention used with a different type of optical transducer.

The present invention may also be used in combination with edge-emitting solid state devices. As can be seen in FIG. 5, and edge-emitting device 52 is typically mounted on the side wall of a copper block 54 which serves as a heat sink for the device. A signal coupling element 56 extends through the supporting ceramic substrate 58 to provide optical and, optionally, electrical coupling to the device 52. Conventional solid metal pins 60 may extend through the ceramic substrate 58 to provide necessary electrical connections. Moreover, some of the metal pins may extend into copper block 54 to provide a thermal path through the ceramic substrate to permit heat to be dissipated from a module including the device 52.

While there have been described what are considered to be preferred embodiments of the invention, variations and modification therein will occur to those skilled in the art. Therefore, it is intended that the appended claims shall be construed to include both the preferred embodiments and all such variations and modifications as fall within the true spirit and scope of the invention.

Having thus described my invention, what I claim as new, and desire to secure by Letters Patent is:

1. In the combination of an optical transducer and a supporting insulative substrate, wherein said substrate has at least one aperture therethrough aligned with the transducer, an improved signal coupling element comprising:

a hollow metal pin extending through the substrate aperture and being secured therein by an interference fit between the exterior surface of said metal pin and the aperture walls;

an optical fiber for transmitting light through the the center of said metal pin, one end of said fiber being adjacent an active region of the transducer;

means for providing an electrical connection between said metal pin and the transducer, said means including an electrically conductive annular button encircling and in conductive contact with said metal pin, said button being on the opposite side of the substrate from the transducer and having a bore therethrough aligned with said optical fiber, the bore having a first cylindrical segment having a diameter approximately equal to the outer diameter of said metal pin and a second coaxial segment which flares from a minimum diameter adjacent the bottom end of said first cylindrical segment to a maximum diameter at one surface of said button.

2. The improved signal coupling element defined in claim 1 wherein said button is made of a metallized glass material.

* * * * *